United States Patent
Klode et al.

(10) Patent No.: US 9,593,964 B2
(45) Date of Patent: Mar. 14, 2017

(54) METHOD OF SENSOR WIRE COUNT REDUCTION

(71) Applicant: Goodrich Corporation, Charlotte, NC (US)

(72) Inventors: Harald Klode, Centerville, OH (US); Albert Keith Pant, Carlisle, OH (US)

(73) Assignee: Goodrich Corporation, Charlotte, NC (US)

( * ) Notice: Subject to any disclaimer, the term of this patent is extended or adjusted under 35 U.S.C. 154(b) by 0 days.

(21) Appl. No.: 15/248,947

(22) Filed: Aug. 26, 2016

(65) Prior Publication Data

US 2016/0363461 A1 Dec. 15, 2016

Related U.S. Application Data

(62) Division of application No. 14/291,391, filed on May 30, 2014, now Pat. No. 9,464,918.

(51) Int. Cl.
| | | |
|---|---|---|
| *G01D 5/14* | (2006.01) | |
| *H03M 5/20* | (2006.01) | |
| *H04L 25/49* | (2006.01) | |
| *G08C 15/02* | (2006.01) | |
| *H04Q 9/00* | (2006.01) | |

(52) U.S. Cl.
CPC .............. *G01D 5/142* (2013.01); *G08C 15/02* (2013.01); *H03M 5/20* (2013.01); *H04L 25/4917* (2013.01); *H04Q 9/00* (2013.01)

(58) Field of Classification Search
CPC ......... G01D 5/142; G08C 15/02; H03M 5/20; H04L 25/4917; H04Q 2209/30; H04Q 9/00

USPC .......................... 324/160–174, 207.2–207.25
See application file for complete search history.

(56) References Cited

U.S. PATENT DOCUMENTS

| | | | | |
|---|---|---|---|---|
| 4,811,229 | A * | 3/1989 | Wilson ................. | G05D 1/0244 180/169 |
| 5,211,063 | A * | 5/1993 | Hobmaier .............. | G08C 19/38 324/207.14 |
| 5,530,345 | A * | 6/1996 | Murari .................. | H01L 43/065 257/426 |
| 2006/0126751 | A1 * | 6/2006 | Bessios ................... | H03M 5/20 375/264 |
| 2013/0251060 | A1 * | 9/2013 | Ikushima ............ | H04L 25/4917 375/286 |
| 2013/0307708 | A1 * | 11/2013 | Hollis ..................... | H03M 5/02 341/56 |

* cited by examiner

*Primary Examiner* — Jay Patidar
(74) *Attorney, Agent, or Firm* — Snell & Wilmer L.L.P.

(57) ABSTRACT

A method of sensor wire count reduction including receiving, from a sensor array comprising a first sensor, a second sensor, the third sensor, a first binary indication of sensor state for the first sensor a second binary indication of sensor state for the second sensor, and a third binary indication of sensor state for the third sensor. The method further includes setting a first voltage in response to the first binary indication of sensor state for the first sensor and the second binary indication of sensor state for the second sensor, determining a first indication comprising whether the fist voltage is within a first range, determining a second indication comprising whether the first voltage is within a second range, and determining a third indication comprising whether the first voltage is within a third range.

6 Claims, 5 Drawing Sheets

| SENSORS | | | LEVEL SETTER | | OUTPUT | | |
|---|---|---|---|---|---|---|---|
| A | B | C | STATE | VIN | A | B | C |
| 0 | 0 | 0 | 3 | $V_6$-$V_7$ | 0 | 0 | 0 |
| 0 | 0 | 1 | 1 | $V_2$-$V_3$ | 0 | 0 | 1 |
| 0 | 1 | 0 | 2 | $V_4$-$V_5$ | 0 | 1 | 0 |
| 0 | 1 | 1 | 0 | $V_0$-$V_1$ | 0 | 1 | 1 |
| 1 | 0 | 0 | 3 | $V_6$-$V_7$ | 1 | 0 | 0 |
| 1 | 0 | 1 | 1 | $V_2$-$V_3$ | 1 | 0 | 1 |
| 1 | 1 | 0 | 2 | $V_4$-$V_5$ | 1 | 1 | 0 |
| 1 | 1 | 1 | 0 | $V_0$-$V_1$ | 1 | 1 | 1 |

FIG.3

METHOD OF SENSOR WIRE COUNT REDUCTION

CROSS REFERENCE TO RELATED APPLICATIONS

This application is a divisional application of, and claims priority to, U.S. application Ser. No. 14/291,391, filed May 30, 2014 and titled "SENSOR WIRE COUNT REDUCTION SYSTEM," which is hereby incorporated by reference in its entirety.

FIELD

The present invention relates to the field of sensors. More particularly, the present invention relates to a system for communicating data from motor position sensors.

BACKGROUND

Aircraft have utilized various motor position sensor systems to provide commutation for different motors, for example, brake actuator motors. Often various control components are connected to the brake actuator motors and the motor position sensor systems by cables. Often, a sensor is connected to other systems by a dedicated mechanism, for communicating electronic information such as a sensor signal. Often this dedicated mechanism is a dedicated wire within a cable. Thus, each sensor often requires its own wire.

SUMMARY OF THE INVENTION

In accordance with various aspects of the present invention, a method of sensor wire count reduction is disclosed. A method of sensor wire count reduction may include receiving, from a sensor array comprising a first sensor, a second sensor, and third sensor, a first binary indication of sensor state for the first sensor, a second binary indication of sensor state for the second sensor, and a third binary indication of sensor state for the third sensor. The method may further include setting a first voltage in response to the first binary indication of sensor state for the first sensor and the second binary indication of sensor state for the second sensor, determining a first indication comprising whether the first voltage is within a first range, determining a second indication comprising whether the first voltage is within a second range, and determining a third indication comprising whether the first voltage is within a third range.

In various embodiments, the method of sensor wire count reduction may further comprise combining the first indication and the third indication, combining the first indication and the second indication, providing a first output in response to the combining the first indication and the third indication, providing a second output in response to the combining the first indication and the second indication. The first output may indicate a state of the first sensor, and wherein the second output indicates a state of the second sensor. The method may further comprise setting a second voltage in response to the third binary indication of sensor state for the third sensor, determining a forth determination comprising whether the second voltage is within a forth range, and providing a third output in response to the determining a forth determination. The method may further comprise determining by a pulse decoder a frequency of activation of the first sensor, the second sensor, and the third sensor. The first sensor, the second sensor, and the third sensor may comprise Hall Effect sensors.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

FIG. 3 depicts a chart illustrating various signals and states of a sensor system;

DETAILED DESCRIPTION

The following description is of various exemplary embodiments only, and is not intended to limit the scope, applicability or configuration of the present disclosure in any way. Rather, the following description is intended to provide a convenient illustration for implementing various embodiments including the best mode. As will become apparent, various changes may be made in the function and arrangement of the elements described in these embodiments without departing from the scope of the appended claims.

For the sake of brevity, conventional techniques for manufacturing and construction may not be described in detail herein. Furthermore, the connecting lines shown in various figures contained herein are intended to represent exemplary functional relationships and/or physical couplings between various elements. It should be noted that many alternative or additional functional relationships or physical connections may be present in a practical method of construction.

Figure 1:
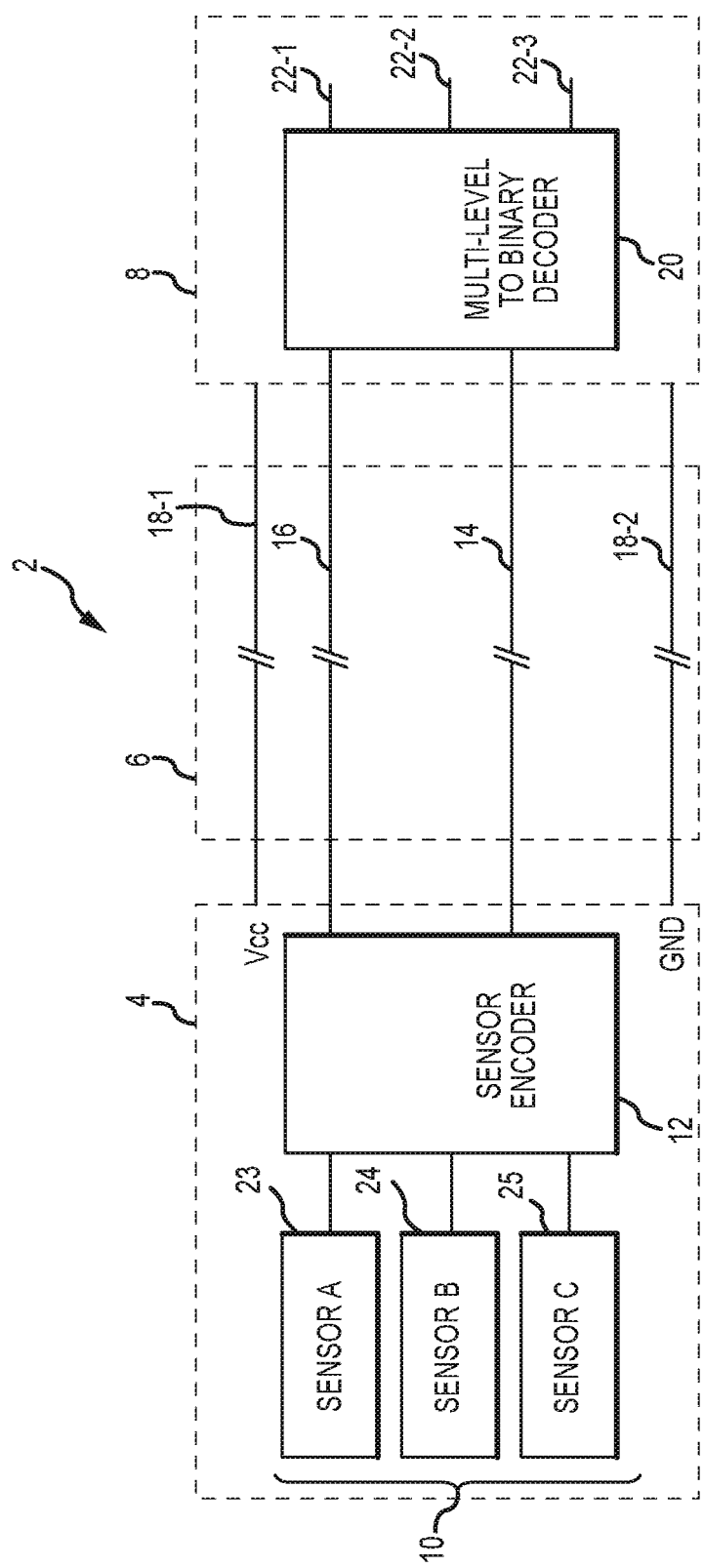
FIG. 1 depicts a diagram of an exemplary embodiment of a sensor system having a cable with reduced wire count.

With reference to FIG. 1, a sensor wire count reduction system 2 is presented. A sensor wire count reduction system 2 comprises a sensor apparatus 4, a transmission cable 6, and a controller 8.

A sensor wire count reduction system 2 may reduce the number of wires utilized to communicate with a given number of sensors versus systems wherein each sensor communicates with other systems via a dedicated mechanism, such as a dedicated wire. For example, in various instances, a sensor wire count reduction system 2 may be implemented with three sensors which otherwise would each require one data wire each. However, the sensor wire count reduction system 2 can combine signals from multiple sensors onto a single wire. In this way, the sensor wire count reduction system 2 decreases the number of wires include in cabling between the sensors and a remote device, such as a controller. Thus, the sensor wire count reduction system 2 decreases the number of wires to be included in transmission cable 6.

Figure 2:
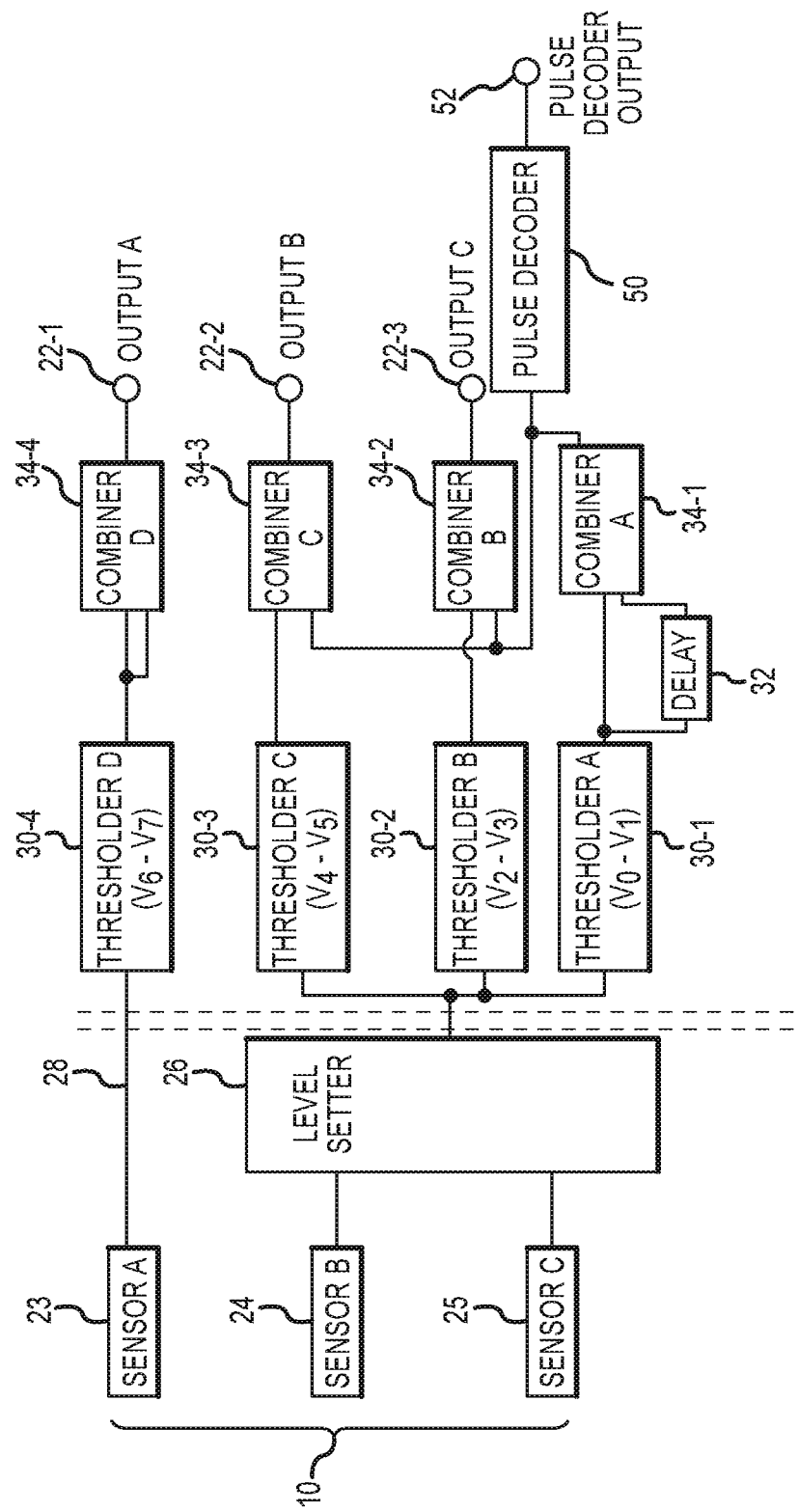
FIG. 2 depicts various aspects of an exemplary embodiment of a sensor system.

In various embodiments, a sensor apparatus 4 comprises a sensor array 10, and a sensor encoder 12. The sensor array 10 may be a number of sensors disposed proximate to a component being sensed. For example, the sensor array 10 may comprise position sensors. In various embodiments, the sensor array 10 comprises at least two Hall Effect sensors. Furthermore, the sensor array 10 may comprise three Hall Effect position sensors, or may comprise four sensors, or may comprise any number of sensors. In various embodiments, the sensor array 10 comprises three sensors evenly disposed about the circumference of a motor. In this manner, the sensor array 10 may sense the position of the motor shaft, for example, to provide commutation to the motor, or to determine motor shaft position, or to determine motor shaft speed. Thus, as illustrated in FIGS. 1 and 2, a sensor array 10 may comprise a Sensor A 23, a Sensor B 24, and a Sensor C 25. Sensor A 23 may be disposed 120 degrees from Sensor B 24 and Sensor C 25, and Sensor B 24 may be disposed 120 degrees from Sensor A 23 and Sensor C 25, so that the sensors are positioned 120 degrees apart about a motor for which sensing is to be provided.

A sensor apparatus 4 may comprise a sensor encoder 12. With reference to FIG. 1, the sensor encoder 12 may be in electrical communication with the sensor array 10. As used herein, electrical communication may refer to any electrical, electromagnetic, radiofrequency and/or optical method whereby information may be conveyed. The sensor encoder 12 may receive signals from the sensor array 10. In various embodiments, each sensor (Sensor A 23, Sensor B 24, Sensor C 25) provides a binary output (e.g., a high or low voltage or a digital signal of a 0 or 1) indicative of whether that sensor is triggered or is not triggered. The binary output of some or all of the sensors in sensor array 10 is input to the sensor encoder 12. In various embodiments, sensor encoder 12 may be adapted to receive signals from multiple sensors.

In various embodiments, the sensor encoder 12 permits a portion of the signals to pass directly through without processing, for example, with reference to FIG. 2, sensor encoder 12 may comprise a level pass-through 28. A level pass-through 28 may comprise an electrical or logical mechanism, such as a wire, whereby a signal, for example, from Sensor A 23, may pass through without processing. The sensor encoder 12 may also have a level setter 26.

As will be discussed further herein, some or all of the sensors of sensor array 10 may be in electrical communication with the level setter 26 component of the sensor encoder 12. With reference to both FIGS. 1 and 2, the sensor apparatus 4, including the level setter 26, may be in electrical communication with a transmission cable 6. In this manner, signals may be conveyed from the sensor array 10, to other components of the sensor apparatus 4, such as the sensor encoder 12, after which they may be conveyed to a transmission cable 6 for conduction to other systems or system components.

A transmission cable 6 may comprise a multiple conductor cable. Alternatively, a transmission cable 6 may comprise an assembly of separate individual conductors. Furthermore, a transmission cable 6 may comprise shielding elements, and may comprise conductors of different gauges. In various embodiments, the transmission cable 6 comprises a multi-level signal wire 14 in electrical communication with the level setter 26 of the sensor encoder 12. Similarly, the transmission cable 6 may comprise a single-level signal wire 16 in communication with the level pass-through 28 of the sensor encoder 12. The transmission cable 6 may also conduct power to various aircraft systems and devices, including components of the sensor wire count reduction system 2. Accordingly, the transmission cable 6 may further comprise multiple power wires, for instance, a power wire 18-1 and a power wire 18-2. Still furthermore, a transmission cable 6 may not be a standalone cable, but may be a logical subset or portion of a larger cable or cable system.

A level pass-through 28 may comprises a logical and/or electrical connection through the sensor encoder 12 whereby signals may be transmitted to the transmission cable 6 without encoding or decoding. Some signals may remain on their own channels, for instance, Sensor A 23 may be logically and/or electrically connected to single-level signal wire 16 of transmission cable 6.

A multi-level signal wire 14 may comprise an electrical and/or logical connection whereby multiple signal levels may be encoded. However, a multi-level signal wire 14 may not be an actual wire, but may comprise an RF or optical link, or may comprise a logical communication layer, bus, or protocol, or may comprise any other mechanism of conveying electronic information.

A single-level signal wire 16 may comprise an electrical and/or logical connection whereby multiple signal levels may be encoded. However, a single-level signal wire 16 may not be an actual wire, but may comprise an RF or optical link, or may comprise a logical communication layer, bus, or protocol, or may comprise any other mechanism of conveying electronic information.

The transmission cable 6 may conduct signals to a controller 8. A controller 8 may be disposed at some distance from the sensor apparatus 4. For example, the sensor apparatus 4 may be located proximate to an aircraft brake actuation motor while the controller 8 may be located within the aircraft fuselage, for example, proximate to a controller, or a computer, or a power source.

With reference to FIGS. 1 and 2, a controller 8 may comprise a multilevel to binary decoder 20 and outputs 22-1, 22-2, and 22-3. In various embodiments, the controller 8 optionally comprises a pulse decoder 50. The controller 8 may provide processed output data in response to the sensors. The controller 8 may process the signals from the transmission cable 6 and create output indicative of the state of the sensor array 10. The controller 8 may be located at a remote distance from the sensor apparatus 4, and connected by transmission cable 6.

A multi-level to binary decoder 20 may be in electrical communication with the multi-level signal wire 14. The multi-level signal wire 14 may provide a multi-level signal, which the multi-level to binary decoder 20 then converts to multiple binary signals. Thus, the data provided from Sensor A 23, Sensor B 24, and Sensor C 25 may be decoded and separately output on separate outputs 22-1, 22-2, and 22-3.

Outputs 22-1, 22-2, and 22-3 may comprise binary outputs. Each output may indicate a high or low voltage in response to a high or low binary state. In various embodiments, each sensor is mapped to a different output. Sensor A 23 may be mapped to Output 22-1, Sensor B 24, may be mapped to Output 22-2, and Sensor C 25 may be mapped to Output 22-3. The output may be represented as a three-bit binary number, or the output may be thought of as an array of wholly separate channels of data. Moreover, in various embodiments, one or more sensors, such as Sensor A 23, are in direct communication with an output and/or the multi-level to binary decoder 20, without passing through the level setter 26 of the sensor encoder 12, but rather passing through level pass-through 28 of the sensor encoder 12, then connected via single-level signal wires 16 of the transmission cable 6 to the controller 8, for example, as Sensor A 23 is mapped to Output 22-1 and passes directly through to it.

As indicated previously, the controller 8 may comprise a pulse decoder 50 that may be an apparatus that counts level transitions (e.g., changes in the voltage of the signal) received at the multi-level to binary decoder 20. In this manner, the pulse decoder 50 may indicate the frequency of sensor activation. For example, if the sensors are implemented to facilitate motor commutation or to evaluate motor speed or motor position, then the pulse decoder 50 may provide an indication of each level transition. Accordingly, the revolutions per minute (RPM) of the motor may be indicated by the pulse decoder 50. The pulse decoder 50 may comprise a pulse decoder output 52 where this indication is provided. In various embodiments, the pulse decoder output 52 provides a square wave in response to the frequency of sensor activation, though it may provide pulses, or a triangle wave, or a saw tooth wave, or a series of impulse transients or any other output indicative of sensor activation.

Figure 4:
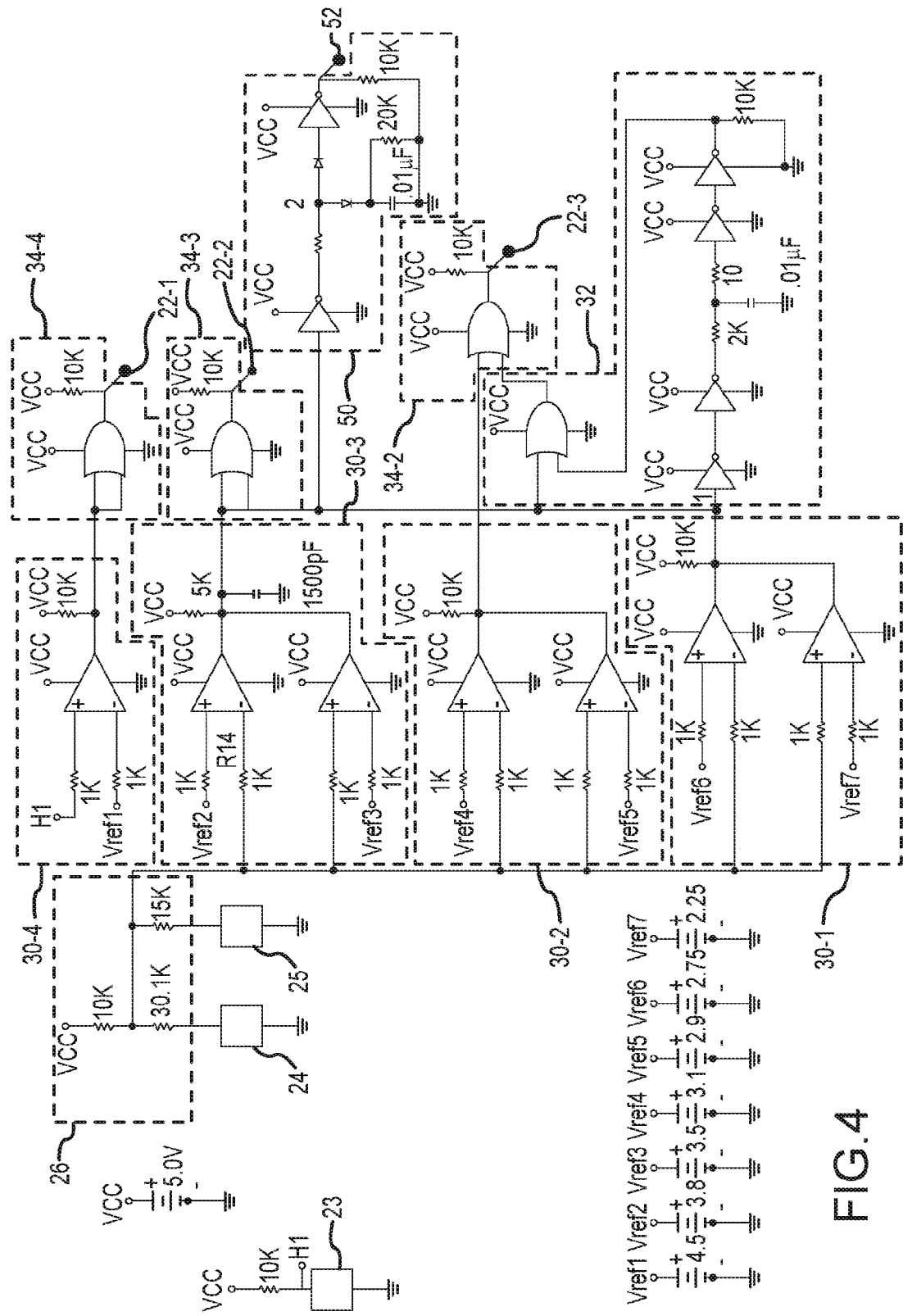
FIG. 4 depicts a detailed schematic diagram of an exemplary embodiment of a sensor system.

With focus on FIGS. 1, 2, and 4, a sensor array 10 may comprise a Sensor A 23, a Sensor B 24, and a Sensor C 25, as previously discussed. A sensor array 10 may comprise similar or different sensors. In various embodiments, a sensor array 10 comprises all Hall Effect sensors, though in other embodiments, a sensor array 10 may comprise a combination of different sensors, for example Hall Effect sensors, mechanical switches, reed switches, or capacitive proximity sensors, or any other sensor or number of sensors adapted for a particular purpose.

A sensor encoder 12 may comprise a level setter 26. A level setter 26 may comprise an electronic circuit whereby the binary state of sensors, for example, Sensor B 24 and Sensor C 25 are converted into a multi-state signal. For instance, a voltage divider circuit may be implemented whereby different voltages are output depending on the different states of Sensor B 24 and Sensor C 25. Sensor B and Sensor C 25 may each comprise a switch, for example a Hall Effect sensor. In response to a sensor indicating a "HI" binary state, the sensor may conduct electricity and in response to a sensor indicating a "LO" binary state, the sensor may be non-conductive. Different legs of the voltage divider circuit may be made conductive or non-conductive and a source voltage may be divided in different ways. In this manner, the voltage divider circuit may be implemented to provide different output voltages depending on the different conduction states of Sensor B 24 and Sensor C 25.

In various embodiments, each sensor further comprises a transistor. For example, in various embodiments, a sensor, for example, a Hall Effect sensor, may control the gate of a transistor, for example a field-effect transistor comprising a selectably conductive path. In various embodiments, the gate voltage of the transistor may be pulled HI or LO in response to the sensor detecting an event. Accordingly, the field-effect transistor may be a p-channel FET, or an n-channel FET. Alternatively, other transistors such as BJTs, whether NPN or PNP, may be implemented, or in some embodiments, for example, if the Hall Effect sensors have sufficient current capacity, no transistors at all may be implemented, but the Hall Effect sensors may provide the conduction paths without a transistor, rather than comprising transistors or other voltage-controlled switches or other current-controlled switches.

Various current limiting resistors may be selected for the different conduction paths of the voltage divider, causing different voltages to be present at the output of the voltage divider, depending on the combination of conduction paths which are conducting at any time (e.g., depending on the HI/LO state of the Hall Effect sensors). In various embodiments, the selected components are of the values reflected in FIG. 4. The level setter 26 may be in electrical communication with the multi-level signal wire 14 of the transmission cable 6 (FIG. 1). In this manner, the different voltages may be conducted to a controller 8 (FIG. 1) for decoding.

In various embodiments, the level setter 26 may set any number of output states (e.g. voltage levels). For example, a level setter 26 may be in communication with two sensors, Sensor B 24 and Sensor C 25. Each sensor may have two states, on and off (e.g., HI and LO). Thus, level setter 26 may have four possible output states. As one may appreciate, a level setter 26 in communication with bi-state sensors may have 2^n states, where n is the number of sensors. Further generalized, a level setter 26 may have x^n states wherein the level setter 26 is in communication with N x-state sensors. A level setter 26 may comprise any circuitry whereby separate channels of data (e.g., sensors) are combined on a single channel of data (e.g., multi-level signal wire 14).

With specific reference to FIGS. 1 and 2, a multi-level to binary decoder 20 may comprise a thresholder and a combiner. The multi-level to binary decoder 20 may comprise multiple thresholders, for example Thresholder A 30-1, Thresholder B 30-2, Thresholder C 30-3, and Thresholder D 30-4. Each thresholder may be configured to determine whether the multi-level signal wire 14 is indicating a voltage above or below a given threshold. By implementing multiple thresholders, multiple such thresholds may be assessed. In various embodiments, each thresholder indicates a binary state in response to the determination of whether the signal is above or below the threshold (for example, Thresholder D 30-4), or may provide a binary state in response to the determination of whether the signal is within a threshold range or outside a threshold range (for example, Thresholder A 30-1, Thresholder B 30-2, and Thresholder C 30-3).

The multi-level to binary decoder 20 may further comprise combiners that combine this state information arising from determinations made by multiple thresholders. For example, a multi-level to binary decoder 20 may comprise multiple combiners. For example, Combiner B 34-2 may combine outputs from Thresholder A 30-1 and Thresholder B 30-2. Similarly, Combiner C 34-3 may combine outputs from Thresholder A 30-1 and Thresholder C 30-3. Still furthermore, Combiner D 34-4 may combine an output from Thresholder D 30-4 with itself, for example, for delay, isolation, and/or signal conditioning, rather than actual combination of signals. Similarly, Combiner A 34-1 may combine an output from Thresholder A 30-1 with a delayed (via delay circuitry 32) output from Thresholder A 30-1 to ameliorate noise. The combiners may combine various outputs of various thresholders.

An embodiment of the interconnection of thresholders and combiners is shown in FIG. 2. For example, Thresholder C 30-3 and Thresholder A 30-1 may both provide binary output signals indicative of whether a multi-level signal provided on multi-level signal wire 14 (FIG. 1) is inside or outside of various ranges. The binary output signal of Thresholder A 30-1 and Thresholder C 30-3 may be provided to Combiner C 34-3. The Combiner C 34-3 may provide a binary output signal to Output 22-2. A combiner may comprise a logical-OR operation, for instance, as performed by an OR gate, so that a HI is indicated if any thresholder connected to it indicates a HI state. For example, Combiner C 34-3 may indicate a HI state if either of Thresholder C 30-3 and Thresholder A 30-1 indicate a HI, for instance, in the event that a multi-level signal provided on multi-level signal wire 14 is within a range assessed by either of Thresholder C 30-3 or Thresholder A 30-1.

Similarly, Thresholder B 30-2 and Thresholder A 30-1 may be interconnected with Combiner B 34-2. Still furthermore, Thresholder D 30-4 may be interconnected with Combiner D 34-4, but without any other thresholder. Thresholder D 30-4 may be combined with itself so that the signal may be conditioned and provided to output 22-1. Combiner D 34-4 may simply condition the signal to have similar characteristics common with the signals provided to output 22-2 and output 22-3 that have been combined via combiners.

With reference to FIGS. 2 and 4, in various embodiments, a thresholder may comprise a pair of OP-AMP comparators. Each may be provided with a different reference voltage. The OP-AMPs may thus be configured to provide an output indication of whether an input voltage falls between the two reference voltages, or falls outside the two reference voltages. Alternatively, a thresholder may comprise a single OP-AMP comparator provided with a reference voltage in order to provide an output indication of whether the input voltage falls above or below the reference voltage. In this manner, the thresholder may decode information. An embodiment of various threshold voltages and component values is indicated in FIG. 4.

In various embodiments, delay circuitry 32 may be implemented in connection with thresholders and combiners. For example, at various points it may be desirable to delay signals entering the combiners 34, for example, to ensure that state transitions are properly timed or to ensure that race states are avoided. As illustrated in FIG. 2, a delay circuitry 32 may be disposed between Thresholder A 30-1 and Combiner A 34-1. In this manner, it may be ensured that components have ample processing time to permit signals to propagate. In this manner, unwanted transient changes, such as race states at various outputs, for example Output 22-2 and/or Output 22-3 and/or the pulse decoder output 52 may be ameliorated.

Pulse decoder 50 may comprise logical gates and filtering components. For example, pulse decoder 50 may comprise inverters and diodes. In various embodiments, two inverters are implemented with a diode filter disposed between the inverters. Pulse decoder 50 may provide a pulse decoder output 52, which is filtered by the diodes and invertors, as well as delayed so that the pulse decoder output 52 is substantially synchronous with the outputs 22-1, 22-2, and 22-3. An example embodiment of a pulse decoder 50 is illustrated in FIG. 4.

Having discussed various aspects of a sensor wire count reduction system 2, attention is now directed to FIGS. 2-4, but with particular emphasis on FIG. 3, which illustrates various different states of a sensor wire count reduction system 2. As reflected in FIG. 3, a '0' and a '1' represent different binary states. As one can appreciate, the outputs reflect states equivalent to those of the sensors. Output 22-1 may reflect Sensor A 23, Output 22-2 may reflect Sensor B 24, and Output 22-3 may reflect Sensor C 25. As previously discussed, Sensor B 24 and Sensor C 25 are connected to the level setter 26, thus the level setter 26 may also have different logical states in response to the states of Sensor B 24 and Sensor C 25. These states may be assigned numbers, for example zero through four as shown in the FIG. 3. In each such state, the level setter 26 may provide a signal on the multi-level signal wire 14 of the transmission cable 6. More specifically, the level setter 26 may set a voltage on the multi-level signal wire 14. The level setter 26 may be configured to ensure that each voltage corresponding to a state lies within a different range corresponding to the threshold ranges of the thresholders comprising the controller 8. These ranges may include $V_0$-$V_1$, $V_2$-$V_3$, $V_4$-$V_5$, $V_6$-$V_7$, as illustrated in FIG. 3, and implemented in FIG. 4. In various embodiments, $V_{0-7}$ comprise voltages defined in FIG. 4. In various embodiments, the ranges are chosen to accommodate voltage drop and/or noise, for example, that which may occur across transmission cable 6.

While the systems described herein have been described in the context of aircraft applications; however, one will appreciate in light of the present disclosure, that the systems described herein may be used in various other applications, for example, different vehicles, different sensor applications, and different signal transmission arrangements, or any other vehicle or device, or in connection with industrial processes, or propulsion systems, or any other system or process having need for sensor wire count reduction.

Figure 5:
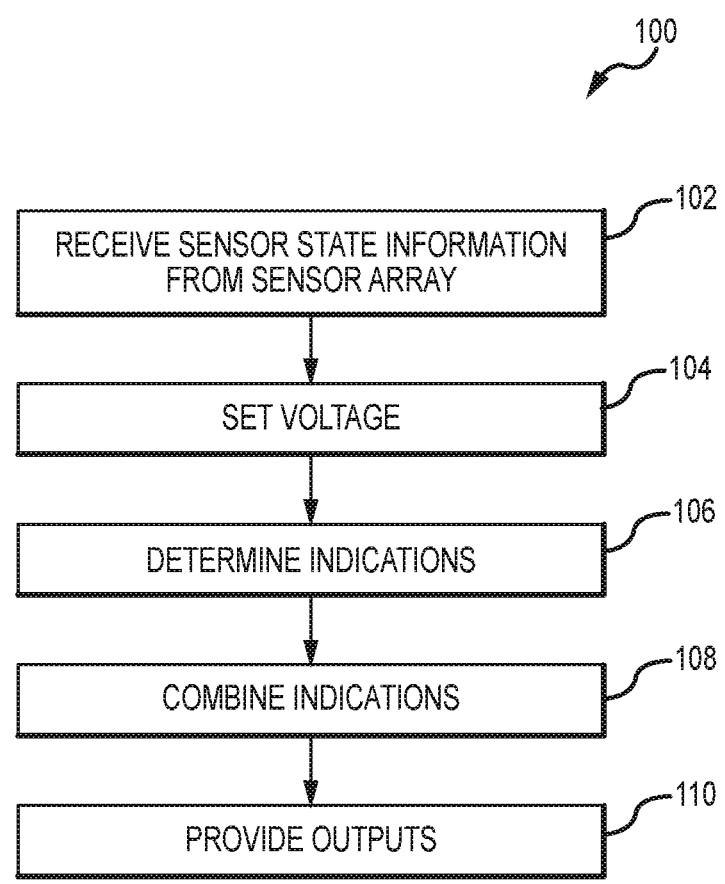
FIG. 5 depicts an exemplary method of sensor wire count reduction.

Moreover, a sensor wire count reduction system 2 may operate according to various methods. For example, with additional reference to FIG. 5, a method 100 may include wherein the sensor encoder 12 receives from a sensor array 10, a binary indication of sensor state for a first sensor (Sensor A 23), a second sensor (Sensor B 24) and a third sensor (Sensor C 25) (Step 102). The sensor encoder 12 may set a first voltage (e.g. state of level setter 26) in response to a binary indication for sensor state for the second sensor (Sensor B 24) and a binary indication of sensor state for the third sensor (Sensor C 25) (Step 104). This voltage may be put on the multi-level signal wire 14 and conveyed to the binary decoder 20. Then, the binary decoder 20 may determine a first indication comprising whether the voltage is within a first range, a second indication comprising whether the first voltage is within a second range, or a third indication comprising whether the first voltage is within a third range (Step 106). These determinations are made at thresholders 30-1, 30-2, and 30-3 as discussed herein. Subsequently the combiners 34-1, and 34-2 may combine certain of the determinations of indications (e.g., HI/LO status indications) as discussed herein (Step 108). Finally, the combiners provide outputs, for example Output 22-2 and Output 22-3 (Step 110). Combiner C 34-3 may combine the first indication and the third indication and Combiner B 34-2 may combine the first indication and the second indication (Step 108). Combiner C 34-3 may provide Output 22-2 in response to the combining the first indication and the third indication and Combiner B 34-2 may provide Output 22-3 in response to the combining the first indication and the second indication (Step 110). Output 22-1 may be provided in response to Sensor A 23 alone, and thus may not be combined with other sensor indications. Rather, a second voltage may be set in response to a binary indication for Sensor A 23 alone and determined whether it is in a fourth range by a thresholder 30-4. A third output, Output 22-1 may be provided in response.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the inventions. The scope of the inventions is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method of sensor wire count reduction comprising:
 receiving, from a sensor array comprising a first sensor, a second sensor, and third sensor, a first binary indication of sensor state for the first sensor, a second binary indication of sensor state for the second sensor, and a third binary indication of sensor state for the third sensor;
 setting a first voltage in response to the first binary indication of sensor state for the first sensor and the second binary indication of sensor state for the second sensor;
 determining a first indication comprising whether the first voltage is within a first range;
 determining a second indication comprising whether the first voltage is within a second range; and
 determining a third indication comprising whether the first voltage is within a third range.

2. The method of sensor wire count reduction according to claim 1, further comprising:
 combining the first indication and the third indication;
 combining the first indication and the second indication;
 providing a first output in response to the combining the first indication and the third indication;
 providing a second output in response to the combining the first indication and the second indication.

3. The method of sensor wire count reduction according to claim 2, wherein the first output indicates a state of the first sensor, and wherein the second output indicates a state of the second sensor.

4. The method of sensor wire count reduction according to claim 3, further comprising:
 setting a second voltage in response to the third binary indication of sensor state for the third sensor;
 determining a forth determination comprising whether the second voltage is within a fourth range; and
 providing a third output in response to the determining a forth determination.

5. The method of sensor wire count reduction according to claim 4, further comprising determining by a pulse decoder a frequency of activation of the first sensor, the second sensor, and the third sensor.

6. The method of sensor wire count reduction according to claim 1, wherein the first sensor, the second sensor, and the third sensor comprise Hall Effect sensors.

* * * * *

UNITED STATES PATENT AND TRADEMARK OFFICE
CERTIFICATE OF CORRECTION

PATENT NO. : 9,593,964 B2  Page 1 of 1
APPLICATION NO. : 15/248947
DATED : March 14, 2017
INVENTOR(S) : Harald Klode et al.

It is certified that error appears in the above-identified patent and that said Letters Patent is hereby corrected as shown below:

On the Title Page

Item (57), Line 3, please delete "the" and insert therefor --and--.

In the Claims

In Column 10, Line 29, please delete "forth" and insert therefor --fourth--.

In Column 10, Line 32, please delete "forth" and insert therefor --fourth--.

Signed and Sealed this
Twenty-third Day of May, 2017

Michelle K. Lee
*Director of the United States Patent and Trademark Office*